United States Patent
Kitade

(10) Patent No.: US 6,694,610 B1
(45) Date of Patent: Feb. 24, 2004

(54) METHOD OF PRODUCING ELECTRONIC COMPONENT

(75) Inventor: Kazuhiko Kitade, Kaga (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/505,755

(22) Filed: Feb. 16, 2000

(30) Foreign Application Priority Data

Feb. 18, 1999 (JP) ............................................. 11-039834
Feb. 7, 2000 (JP) ....................................... 2000-029085

(51) Int. Cl.⁷ .............................. H05K 3/34; H05K 7/14
(52) U.S. Cl. .............................. 29/840; 29/843; 29/852; 29/832; 228/180.21; 174/35 R; 174/260; 361/800; 361/816; 361/818
(58) Field of Search .......................... 29/840, 843, 852, 29/853, 832; 228/180.21, 180.22; 174/52.1, 35 R, 35 GC, 51, 259, 260, 255, 256; 257/731, 732; 361/800, 816, 818

(56) References Cited

U.S. PATENT DOCUMENTS

| | | | | |
|---|---|---|---|---|
| 4,494,095 A | * | 1/1985 | Noji et al. ...................... 334/85 |
| 4,838,475 A | * | 6/1989 | Mullins et al. .............. 228/179 |
| 4,916,805 A | * | 4/1990 | Ellrich et al. ................. 29/832 |
| 4,951,400 A | * | 8/1990 | Elliott et al. ............... 29/840 X |
| 4,959,505 A | * | 9/1990 | Ott ............................. 174/52.2 |
| 5,217,922 A | * | 6/1993 | Akasaki et al. ............. 437/183 |
| 5,219,794 A | * | 6/1993 | Satoh et al. ................. 437/209 |
| 5,317,803 A | * | 6/1994 | Spigarelli et al. ............. 29/840 |
| 5,357,673 A | * | 10/1994 | Polak et al. ................... 29/840 |
| 5,394,011 A | * | 2/1995 | Yamamoto et al. ......... 257/693 |
| 5,488,765 A | | 2/1996 | Kubota et al. |
| 5,621,619 A | * | 4/1997 | Seffernick et al. .......... 361/773 |
| 5,653,019 A | * | 8/1997 | Bernhardt et al. ............ 29/840 |
| 5,706,579 A | * | 1/1998 | Ross ............................. 29/840 |
| 5,724,728 A | * | 3/1998 | Bond et al. .................... 29/840 |
| 5,763,824 A | * | 6/1998 | King et al. ................ 174/35 R |
| 5,839,190 A | * | 11/1998 | Sullivan ....................... 29/840 |
| 5,844,784 A | * | 12/1998 | Moran ......................... 361/818 |
| 5,867,898 A | * | 2/1999 | Lauffer et al. ................. 29/840 |
| 5,898,344 A | * | 4/1999 | Hayashi ........................ 331/67 |
| 5,911,356 A | | 6/1999 | Tsurusaki |
| 5,917,708 A | * | 6/1999 | Moran et al. ................ 361/800 |
| 6,025,998 A | * | 2/2000 | Kitade ......................... 361/800 |
| 6,075,289 A | * | 6/2000 | Distefano .................... 257/732 |
| 6,079,099 A | * | 6/2000 | Uchida et al. ............ 29/832 X |
| 6,230,399 B1 | * | 5/2001 | Maheshwari et al. ......... 29/840 |
| 6,256,877 B1 | * | 7/2001 | Hacke et al. .................. 29/832 |
| 6,263,564 B1 | * | 7/2001 | Holmberg et al. ............ 29/840 |
| 6,388,535 B1 | | 5/2002 | Otsuki et al. |

FOREIGN PATENT DOCUMENTS

| | | | | |
|---|---|---|---|---|
| CN | 1197327 A | 10/1998 | | |
| JP | 227797 | 1/1990 | | |
| JP | 10013078 | * | 1/1998 | .................. 29/837 |

* cited by examiner

Primary Examiner—A. Dexter Tugbang
(74) Attorney, Agent, or Firm—Keating & Bennett, LLP

(57) ABSTRACT

A method of producing an electronic component including the steps of applying solder paste to both a connection land electrode, to which a surface-mount part is to be electrically and mechanically connected, and a case-fixing electrode, to which an engaging portion of a shield case is to be electrically and mechanically connected and affixed; mounting the surface-mount part and the shield case onto predetermined locations of a printed board, the shield case being mounted so as to accommodate the surface-mount part therein; and after the mounting step, soldering the surface-mount part and the shield case onto the printed board at the same time by putting printed board, having the surface-mount part and the shield case mounted thereon, into a reflow oven. The electronic component production method makes it possible to efficiently produce an electronic component having a structure in which a surface-mount part is accommodated in a shield case.

12 Claims, 9 Drawing Sheets

METHOD OF PRODUCING ELECTRONIC COMPONENT

BACKGROUND OF THE INVENTION

1. Field of the Invention

The present invention relates to an electronic component and a method of producing the same, and more particularly to an electronic component, such as a high-frequency composite module used in the communication field, having a structure in which a surface-mount part is accommodated in a case, and a method of producing the same.

2. Description of the Related Art

One method of producing an electronic component 60 having a structure in which surface-mount parts 64 are accommodated in a shield case 65 is illustrated in FIG. 9. It is disclosed in, for example, Japanese Unexamined Patent Publication No. 10-13078.

According to this method, the electronic component 60 is producing by carrying out the following steps 1 to 6.

Step 1: As shown in FIG. 10, through holes 62 are formed in a sheet board 61 comprising a plurality of boards 51 for mounting parts thereon, and electrodes 63 for mounting shield cases 65 thereon are formed at side surfaces defining the through holes 62.

Step 2: Then, the surface-mount parts 64 are mounted onto the sheet board 61, and soldered onto land electrodes (not shown) on the sheet board 61.

Step 3: After the soldering, the through holes 62 are filled with solder pastes 67.

Step 4: After the filling, pawls (engaging portions) 66 of a plurality of the shield cases 65 are inserted into their corresponding through holes 62 filled with the solder pastes 67.

Step 5: Next, the solder in the solder pastes 67 is melted in order to solder the shield cases 65 onto the sheet board 61. As shown in FIG. 9, the pawls (engaging portions) 66 of each shield case 65 are joined and affixed to the sheet board 61 by soldering them onto the electrodes 63 (see FIG. 10) in the through holes 62.

Step 6: After affixing the pawls 66, the sheet board 61 is cut along line A—A with, for example, a dicing machine, whereby individual electronic components 60, one of which is shown in FIG. 9, are obtained.

Accordingly, in this conventional method, after soldering the surface-mount parts 64 onto the sheet board 61 (step 2), the shield cases 65 are mounted onto the sheet board 61 in order to insert the pawls 66 into their corresponding through holes 62 filled with the solder pastes 67 (step 4). Thereafter, the solder in the solder pastes 67 filling the through holes 62 is melted in order to solder the shield cases 65 onto the electrodes 63 in the sheet board 61 (step 5). However, in this conventional method, two soldering steps, namely, the step of soldering the surface-mount parts 64 and the step of soldering the shield cases 65 are required. This restricts productivity.

In addition, in the above-described conventional method, the step of soldering the surface-mount parts 64 is generally carried out using a reflow soldering method. After soldering the surface-mount parts 64 by the reflow soldering method, the shield cases 65 are separately soldered by the same reflow soldering method. This means that the surface-mount parts 64 are put into a reflow oven twice. When the surface-mount parts 64 are put into the reflow oven twice, the properties of the surface-mount parts 64 may change because of the high temperature in the reflow oven. This results in the problem of reduced reliability of the products.

SUMMARY OF THE INVENTION

Accordingly, in order to overcome the above-described problems, it is an object of the present invention to provide an electronic component production method that allows electronic components having a structure in which surface-mount parts are accommodated in shield cases to be efficiently produced without causing changes in the properties thereof; and to provide highly reliably electronic components that are efficiently produced by this method.

To this end, according to one aspect of the present invention, there is provided an electronic component production method in which the electronic component has a structure in which a surface-mount part is accommodated in a shield case, the method comprising the steps of:

applying solder paste to a connection land electrode, to which the surface-mount part is to be electrically and mechanically connected, and a case-fixing electrode, to which an engaging portion of the shield case for accommodating the surface-mount part is to be electrically and mechanically joined and affixed, the connection land electrode and the case-fixing electrode being disposed on a printed board onto which the surface-mount part is to be mounted;

mounting the surface-mount part and the shield case onto predetermined locations of the printed board, the shield case being mounted so as to accommodate the surface-mount part therein; and carrying out reflow soldering in order to solder at the same time the surface-mount part onto the connection land electrode and the engaging portion of the shield case onto the case-fixing electrode by putting the printed board on which the surface-mount part and the shield case are mounted into a reflow oven and melting the solder in the solder paste.

In this case, solder paste is applied to both the connection land electrode, to which the surface-mount part is to be electrically and mechanically connected, and case-fixing electrode, to which the engaging portion of the shield case is to be electrically and mechanically joined and affixed. Next, with the paste being applied, the surface-mount part is mounted onto a predetermined location of the printed board, and the shield case is mounted onto the printed board so that the surface-mount part is accommodated in the shield case. Then, the printed board is put into the reflow oven in order to solder the surface-mount part onto the connection land electrode and the engaging portion of the shield case onto the case-fixing electrode used for affixing the case thereto. Therefore, both the surface-mount part and the shield case can be mounted onto the printed board at the same time in one soldering step. Consequently, an electronic component can be efficiently produced without causing changes in the properties thereof. Since the step of melting solder can be finished only at one time and thermal stress to the surface-mount parts can be reduced, deterioration in property due to the thermal stress applied to the surface-mount parts mounted on the printed board can be prevented and the reliability can be improved.

The shield case is prevented from dropping and shielding performance can be improved in a case where stresses from other directions applied to the shield case, since the case-fixing electrode is disposed on the printed board for mounting the surface-mount parts, and the shield case is soldered to the case-fixing electrode.

Another aspect of the present invention provides the manufacturing method in which the solder-paste-applying method is carried out so that the solder paste is applied to the connection land electrode and the case-fixing electrode at the same time.

In the step of applying the solder paste, the solder paste is applied to the connection land electrode and the case-fixing electrode at the same time. In this case, since providing the solder with the printed board, for example, printing or applying can be finished in only one step during entire process, the number of manufacturing steps can be reduced, which leads to improvement of productivity and reduction in manufacturing cost.

Another aspect of the present invention provides the manufacturing method in which the solder-paste-applying method is carried out so that the solder paste is applied in separate stages of manufacturing to the connection land electrode and the case-fixing electrode.

In the step of applying the solder paste, the solder paste is separately applied to the connection land electrode and the case-fixing electrode. In this case, other steps of manufacturing process can be added between the step of applying the solder paste to one electrode and the step of applying the solder paste to the other electrode. This increases design freedom of manufacturing process.

According to another aspect of the manufacturing method of the present invention, the engaging portion of the shield case may be a pawl-shaped protrusion, and the case-fixing electrode may be disposed in an inner periphery of the engaging hole formed in the printed board.

In this case, the engaging portion of the shield case is a pawl-shaped protrusion, and the electrode used for affixing the case thereto is disposed in an inner periphery of the engaging hole formed in the printed board. Therefore, it is possible to reliably join and affix the shield case at the required position with high precision, so that a highly reliable electronic component can be obtained.

Further, according to another aspect of the present invention, when the engaging portion of the shield case is a pawl-shaped protrusion and the case-fixing electrode is disposed in an inner periphery of the engaging hole, the step of applying a solder paste may be carried out such that the solder paste is applied to the printed board so as to cover at least a portion of the engaging hole in the printed board, the engaging hole being used for inserting the engaging portion of the shield case therein.

In this case, in the solder-paste-applying step, the solder paste is applied to the printed board so as to cover at least a portion of the engaging hole in the printed board, the engaging hole being used for inserting the engaging portion of the shield case therein. This makes it possible to supply a sufficient amount of solder paste into the engaging hole and reliably solder the protrusion onto the case-fixing electrode, whereby a more reliable electronic component can be obtained.

In this case, it is not necessary to provide the solder into the engaging hole in such a manner that the solder is completely filled with the engaging hole. It is sufficient to provide a necessary amount of the solder to secure the engaging portion of the shield case. Thus, the amount of the solder to use can be reduced, and reduction in weight and volume of products is achieved. Since it is not required to completely fill the engaging hole with the solder, even when conditions relevant to solder-filling process change, such as the diameter of the engaging hole, the thickness of the printed board or the like, it is not necessary to adjust the amount of the solder to be filled with high precision to stabilize the supply of the solder amount. Therefore productivity is sufficiently maintained.

Since the solder is not completely filled in the engaging hole, the generation of voids in the solder to fix the engaging portion of the shield case (e.g. a pawl-shaped protrusion) and the case-fixing electrode within the engaging hole is suppressed. It is possible to easily confirm the state of affixation of the engaging portion of the shield case and the case-fixing electrode within the engaging hole. Thus the reliability is improved.

When the solder is not completely filled in the engaging hole, and a mother printed board is cut according to each region thereof where each shield case is mounted in order to divide the mother printed board into a plurality of electronic components, burrs of the solder are hard to be formed on the reverse surface of the printed board. It is because portions in which the printed board and the solder in the through hole in the same plane are cut are reduced. Solderability in mounting the electronic component is improved. Since clogging at a dicing blade caused by the solder occurs only to a small extent, the life of the dicing blade is extended. Since only a small amount of solder scraps produced by dicing are stuck onto a product, the product properties do not easily deteriorate.

Further, according to another aspect of the present invention, when the engaging portion of the shield case is a pawl-shaped protrusion and the case-fixing electrode is disposed in an inner periphery of the engaging hole, or when the solder paste is applied to the printed board so as to cover at least a portion of the engaging hole, the engaging portion of the shield case may be formed to a length that does not allow the engaging portion to protrude beyond a back surface side when the engaging portion passes into the engaging hole from a shield-case-mounting surface of the printed board.

In this case, the engaging portion of the shield case is formed to a length that does not allow it to protrude beyond the back side of the engaging hole when it passes into the engaging hole from a shield-case-mounting surface of the printed board. This makes it possible to produce an electronic component which does not have any portions protruding from the back side, which can be easily mounted, and which is suitable for high-density mounting.

According to a method of manufacturing the electronic component of the present invention, a mother printed board that is to be divided into a plurality of electronic components may be used as the printed board; in the mounting step a plurality of surface-mount parts and a plurality of shield cases may be mounted onto the mother printed board; and after the reflow soldering step, the method may further comprise the step of dividing the mother printed board into the plurality of electronic components having the surface-mount parts accommodated in the shield cases by cutting the mother printed board according to each of shield-case-mounted areas.

In this case, in the mounting step, a plurality of surface-mount parts and a plurality of shield cases are mounted onto a mother printed board, and after the reflow soldering step the mother printed board is cut according to each of shield-case-mounted areas in order to divide the mother printed board into individual electronic components. This allows many electronic components to be produced efficiently.

It is possible to apply (supply) solder paste to a mother printed board that is to be cut into a plurality of electronic components and that does not have too small a size. Therefore, it is possible to increase the precision with which the solder paste is supplied to the proper locations and the proper amount of solder paste is supplied. Consequently, efficient production of highly reliable electronic components can be achieved without being restricted by the sizes of individual products. As a result, it is possible to, for example, reduce facility size and working space.

An opening may be formed in at least a portion of the shield case or at least a portion of each shield case, and after soldering the surface-mount part or each surface-mount part and the shield case or each shield case onto the printed board, or after cutting the printed board in the dividing step, an inside of the shield case or each shield case may be cleaned.

In this case, an opening is formed in the shield case or each shield case, and after soldering the surface-mount part or each surface-mount part and the shield case or each shield case onto the printed board, or after cutting the printed board in the dividing step, the inside of the shield case or each shield case is cleaned. Therefore, for example, flux or solder balls produced by the soldering or scraps produced when the board is cut can be removed, thereby reliably preventing quality deterioration.

The location where an opening of the shield case or each shield case is formed is not particularly limited, so that it can be formed in any location. In general, when the shield case or each shield case is a square-shaped case as viewed in a plane, it is preferable that an opening be formed in a pair of opposing side surfaces or in each of four side surfaces. This allows the inside of a shield case to be efficiently cleaned.

According to another aspect of the present invention, there is provided an electronic component produced by the above-described methods, wherein the electronic component has a structure in which the surface-mounted part is soldered onto the connection land electrode on the printed board, and in which the shield case for accommodating the surface-mounted part is soldered onto the case-fixing electrode on the printed board, the shield case having an opening for cleaning the inside of the shield case.

Since the electronic component has a shield case with an opening for cleaning the inside of the shield case in addition, the electronic component can be efficiently produced by the above-described methods. Therefore, stains, such as flux or solder balls produced by the soldering or scraps produced when cutting the board can be cleaned off and removed, thereby maintaining a predetermined quality, so that reliability is enhanced.

DESCRIPTION OF THE PREFERRED EMBODIMENTS

Hereunder, a detailed description of preferred embodiments will be given of the features of the present invention with reference to the drawings.

First Embodiment

A description will be given of a first embodiment of the method of producing an electronic component in accordance with the present invention with reference to FIGS. 1 to 7. In the embodiment, the electronic components are high-frequency electronic components, such as voltage-controlled oscillators (VCOs), used in, for example, communication devices.

Step 1: A mother printed board 11 (see FIG. 1) is made available as a printed board (see FIGS. 4 and 5) used for mounting surface-mount parts 4 and shield cases 5 thereon. The mother printed board 11 is an aggregate of printed boards 1 forming individual electronic components, with the aggregate being divided into a plurality of electronic components.

Figure 1:
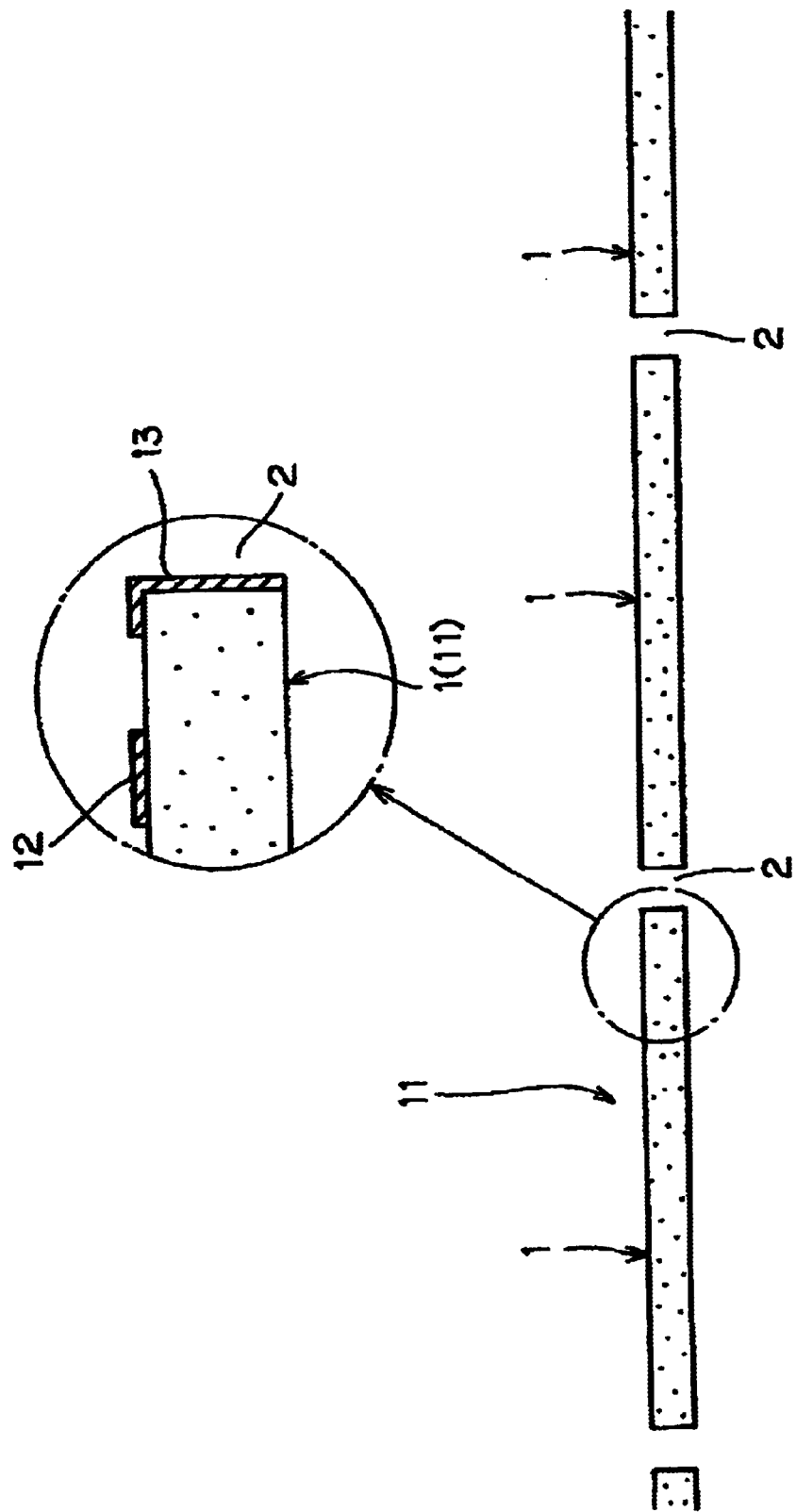
FIG. 1 illustrates a step in a first embodiment of the method of producing an electronic component in accordance with the present invention.

Connection land electrodes 12, to which the surface-mount parts 4 are to be electrically and mechanically connected, are formed on one of the surfaces (the top surface in this embodiment) of the mother printed board 11 (see FIG. 1). The electrodes 12 form portions of wiring patterns. Engaging holes 2 into which engaging portions 6 of the shield cases 5 are inserted are formed in the mother printed board 11, as shown, for example, in FIGS. 4 and 5. Case-fixing electrodes 13, onto which the engaging portions 6 of the shield cases 5 are to be soldered, are formed so as to extend from inner peripheries of the engaging holes 2 to the peripheral portions of the engaging holes 2 on both the top and bottom surfaces of the mother printed board 11.

Figure 2:
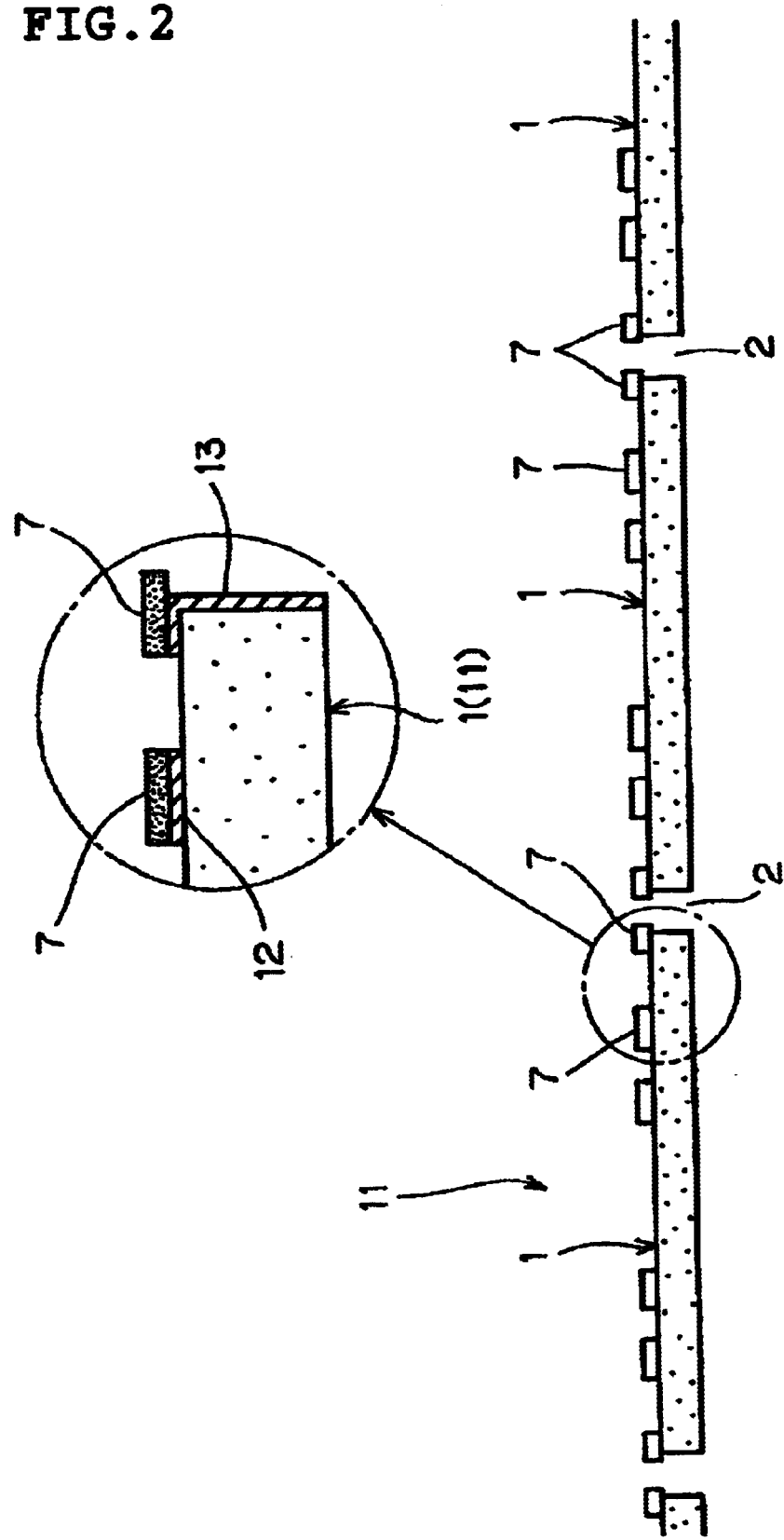
FIG. 2 illustrates another step in the first embodiment of the method of producing an electronic component in accordance with the present invention.

Step 2: As shown in FIG. 2, solder pastes 7 are applied on the connection lands 12, to which the surface-mount parts 4 are to be electrically and mechanically connected, and on the case-fixing electrodes 13, to which the engaging portions 6 of the shield cases 5 for accommodating the surface-mount parts 4 are to be electrically and mechanically joined and affixed. The solder pastes 7 on the case-fixing electrodes 13 are applied so as to cover portions of the engaging holes 2.

The method of applying the solder pastes 7 is not particularly limited, so that they may be applied using a coating device or by printing with a screen printer.

Figure 3:
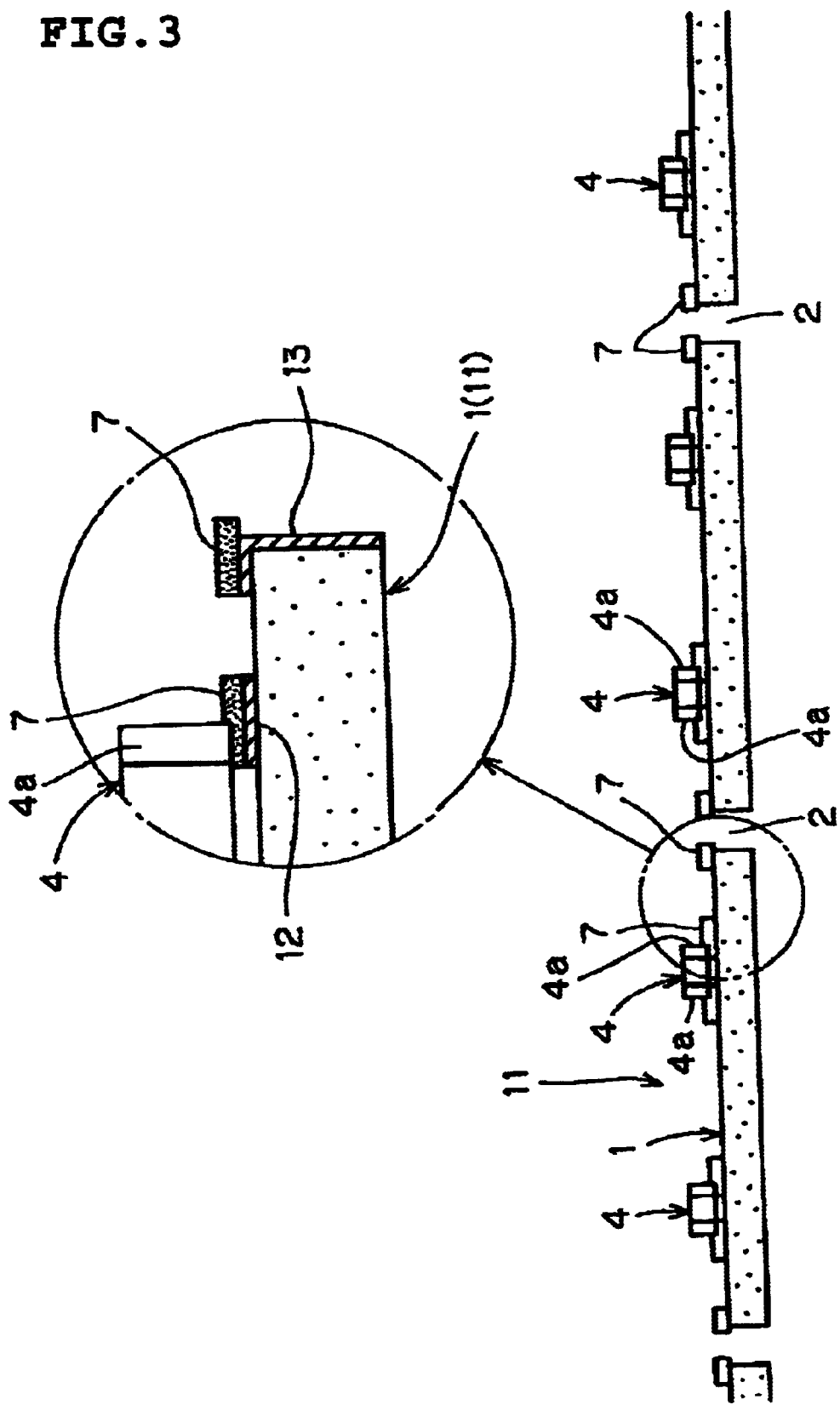
FIG. 3 illustrates still another step in the first embodiment of the method of producing an electronic component in accordance with the present invention.

Step 3: As shown in FIG. 3, the surface-mount parts 4 are mounted onto the solder pastes 7 applied on the connection land electrodes 12. Here, external electrodes 4a of the surface-mount parts 4 are mounted so that they come into sufficient contact with the solder pastes 7. Ordinarily, the surface-mount parts 4 are mounted with an automatic mounting device.

Figure 4:
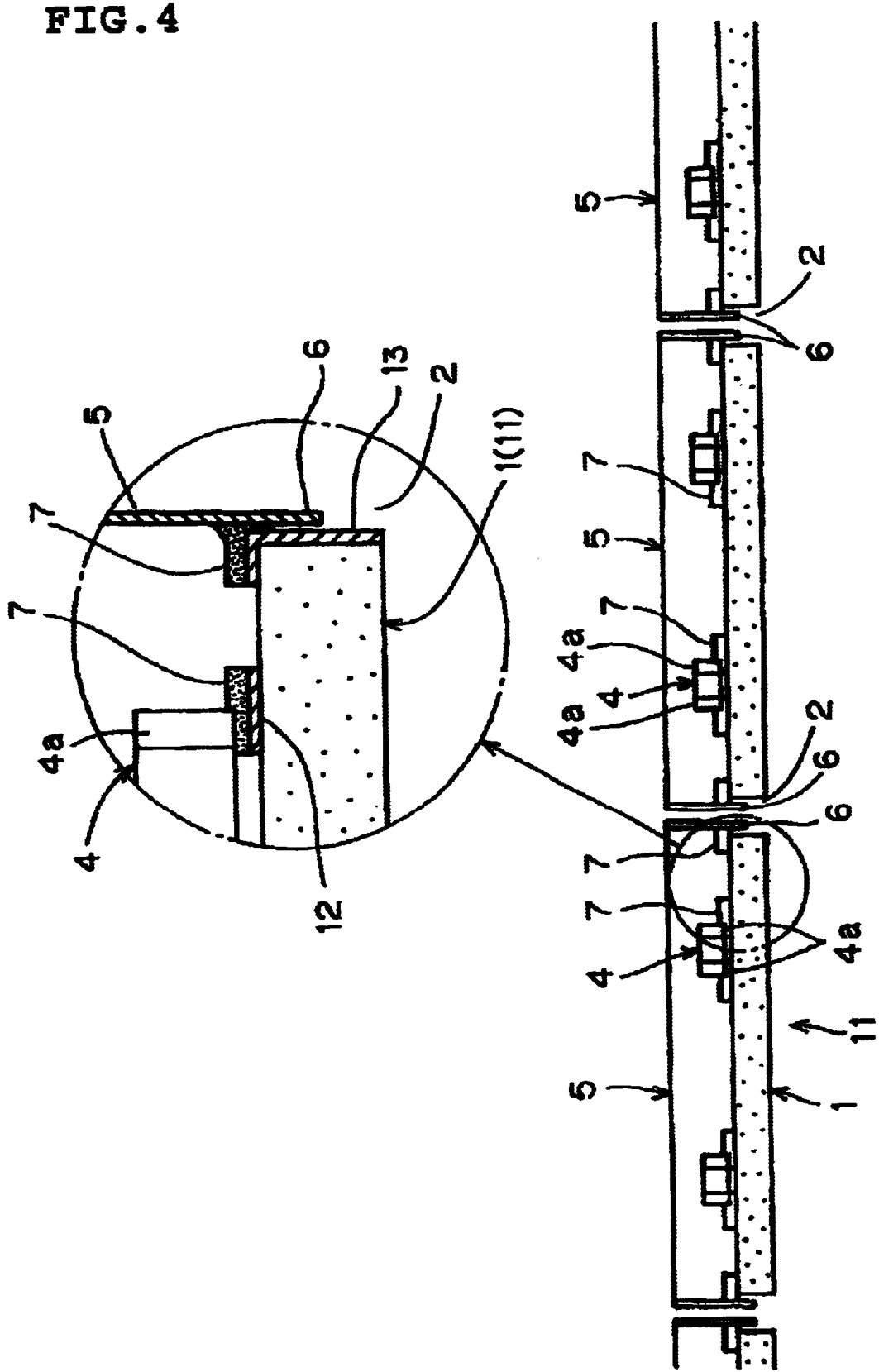
FIG. 4 illustrates still another step in the first embodiment of the method of producing an electronic component in accordance with the present invention.
Figure 5:
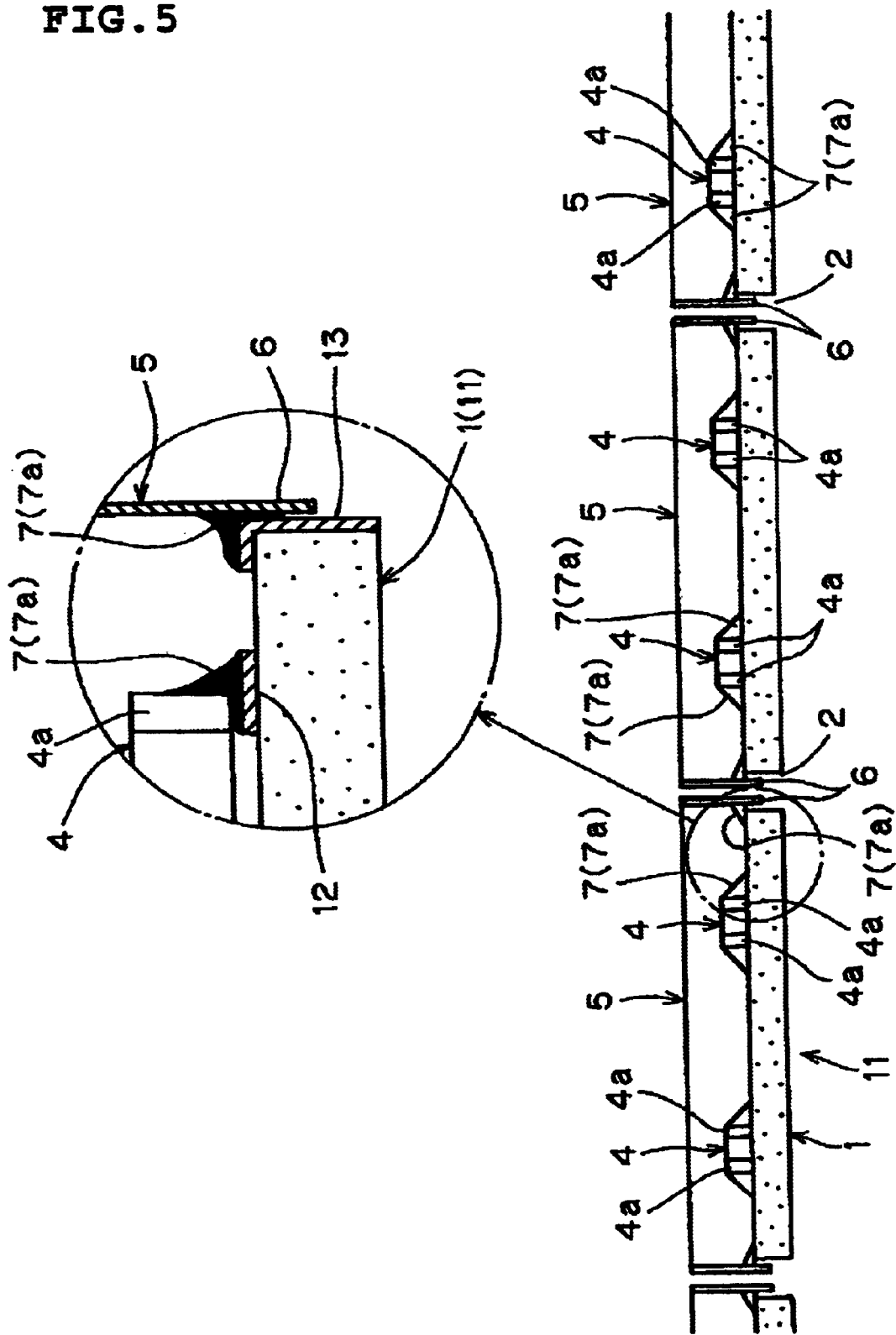
FIG. 5 illustrates still another step in the first embodiment of the method of producing an electronic component in accordance with the present invention.

Step 4: As shown in FIG. 4, the shield cases 5 are mounted onto the mother printed board 11 so that the predetermined surface-mount parts 4 are accommodated therein.

Figure 6:
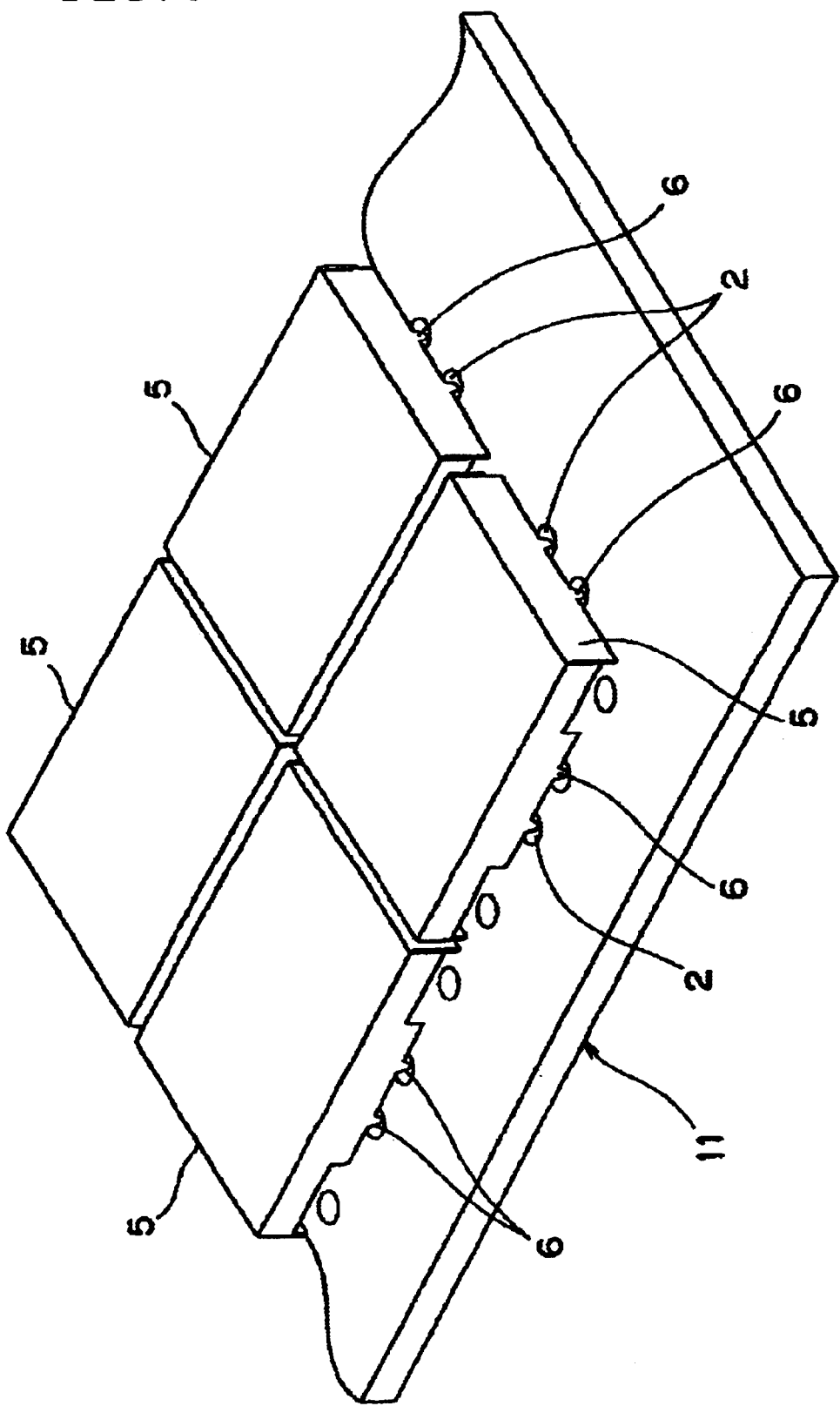
FIG. 6 is a perspective view showing a state in which a plurality of shield cases are mounted on a mother printed board, in the first embodiment of the method of producing an electronic component in accordance with the present invention.
Figure 7:
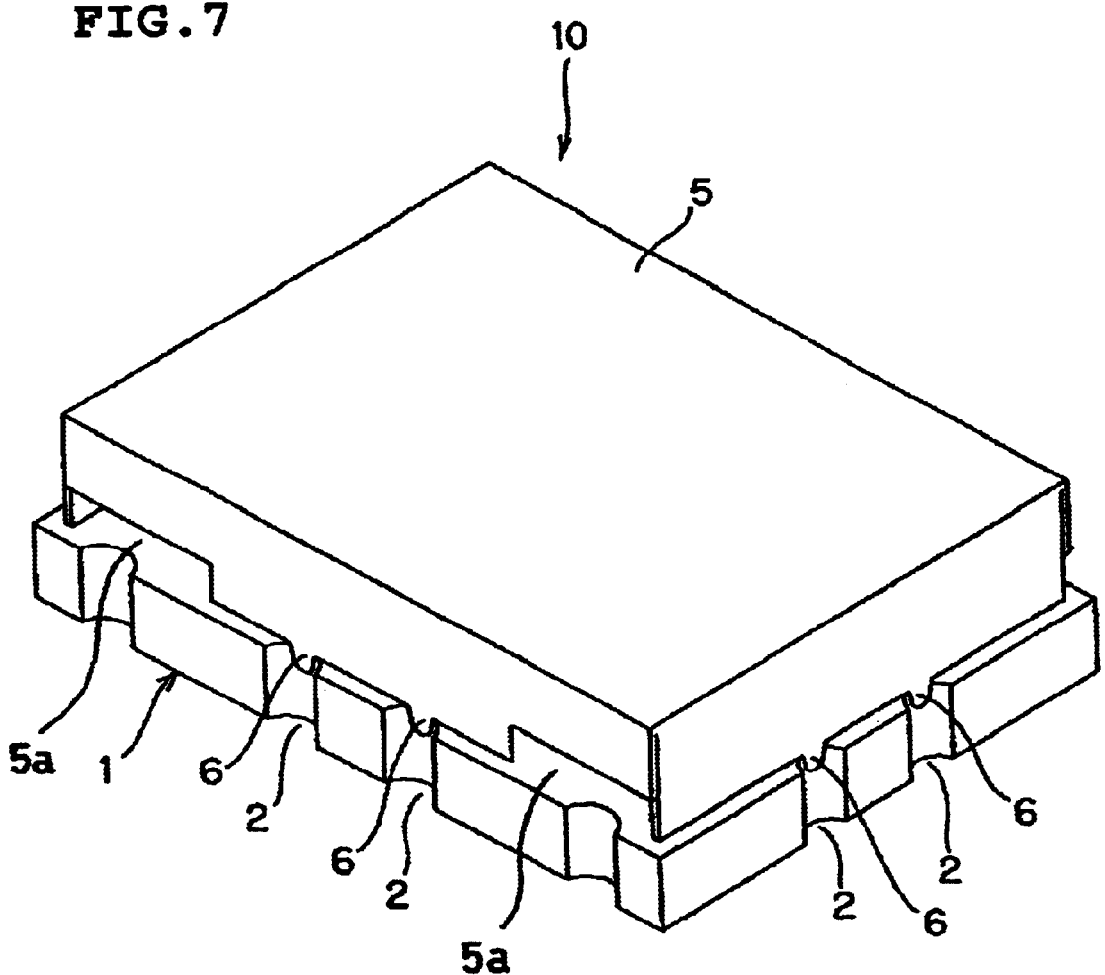
FIG. 7 is a perspective view of an electronic component formed by severing and dividing the mother printed board onto which the surface-mount parts and the shield cases have been soldered, in the first embodiment of the method of producing an electronic component in accordance with the present invention.

In the embodiment, as in FIGS. 6 and 7, the shield cases 5 used are those having pawls as the engaging portions 6 that engage the engaging holes 2 in the mother printed board 11. The pawl-shaped engaging portions 6 are formed to lengths that do not allow them to protrude or extend beyond the back side of the mother printed board 11, when the pawl-shaped engaging portions 6 are disposed so as to extend via the engaging holes 2 from a surface of the mother printed board 11 on which the shield cases 5 are mounted.

The shield cases 5 are mounted onto the mother printed board 11 so that the engaging portions 6 are fitted into the engaging holes 2 in the mother printed board 11.

Step 5: The solder pastes 7 (more specifically, solder 7a in FIG. 5) are melted by putting the mother printed board 11, having the surface-mount parts 4 and the shield cases 5 mounted thereon, into a reflow oven, and then cooled in order to solder the external electrodes 4a of the surface-mount parts 4 onto the connection land electrodes 12 and in order to solder the engaging portions 6 of the shield cases 5 onto the case-fixing electrodes 13 on the mother printed board 11 (see FIG. 5). FIG. 6 illustrates a state in which the shield cases 5 are mounted on the mother printed board 11. For easier understanding, the solder pastes are not shown in FIG. 6.

Step 6: Thereafter, by cutting and dividing the mother printed board, having the surface-mount parts and the shield cases mounted thereon and soldered, in accordance with shield-case-mounted areas, individual electronic components 10 in which the surface-mount parts (not shown) are accommodated in the shield cases 5 are obtained, as shown in FIG. 7. For easier understanding, the solder pastes are not shown in FIG. 7 either.

According to the above-described method, the solder pastes 7 are applied to both the connection land electrodes 12 on which the surface-mount parts 4 are to be soldered and the electrodes 13 on which the engaging portions 6 of the shield cases 5 are to be soldered. After mounting the surface-mount parts 4 and the shield cases 5, the mother printed board 11 is put into the reflow oven in order to solder the surface-mount parts 4 onto the connection land electrodes 12 and in order to solder the engaging portions 6 of the shield cases 5 onto the electrodes 13. Therefore, in this method, the surface-mount parts 4 and the shield cases 5 can be secured to the mother printed board 11 at the same time in one soldering step, making it possible to produce electronic components efficiently.

In addition, since the surface-mount parts 4 are put into the reflow oven only once, it is possible to reduce or prevent changes in the properties of the surface-mount parts 4 caused by heat generated in the reflow oven. This allows electronic components with stable properties to be obtained.

Since the solder pastes 7 are applied (or supplied) to the mother printed board 11 with a plurality of electronic components that are to be divided later, it is possible to increase the precision with which the solder pastes 7 is supplied to the proper locations and the proper amount of solder pastes 7 is supplied. Therefore, efficient production of electronic components can be achieved without being restricted by the sizes of individual products. As a result, it is possible to, for example, reduce the size of manufacturing facility or machines and working space.

In the electronic components 10 in the embodiment, the shield cases 5 in which openings 5a formed in a pair of opposing sides are provided are used (see FIG. 7 only the two openings 5a formed in one side of the pair of the opposing sides are shown). These openings 5a are used to clean the insides of the shield cases 5. Therefore, by cleaning off stains such as flux and solder balls produced by the soldering, and by cleaning off and removing scraps produced when cutting the board, it is possible to prevent quality deterioration and thus to enhance reliability.

Second Embodiment

Figure 8:
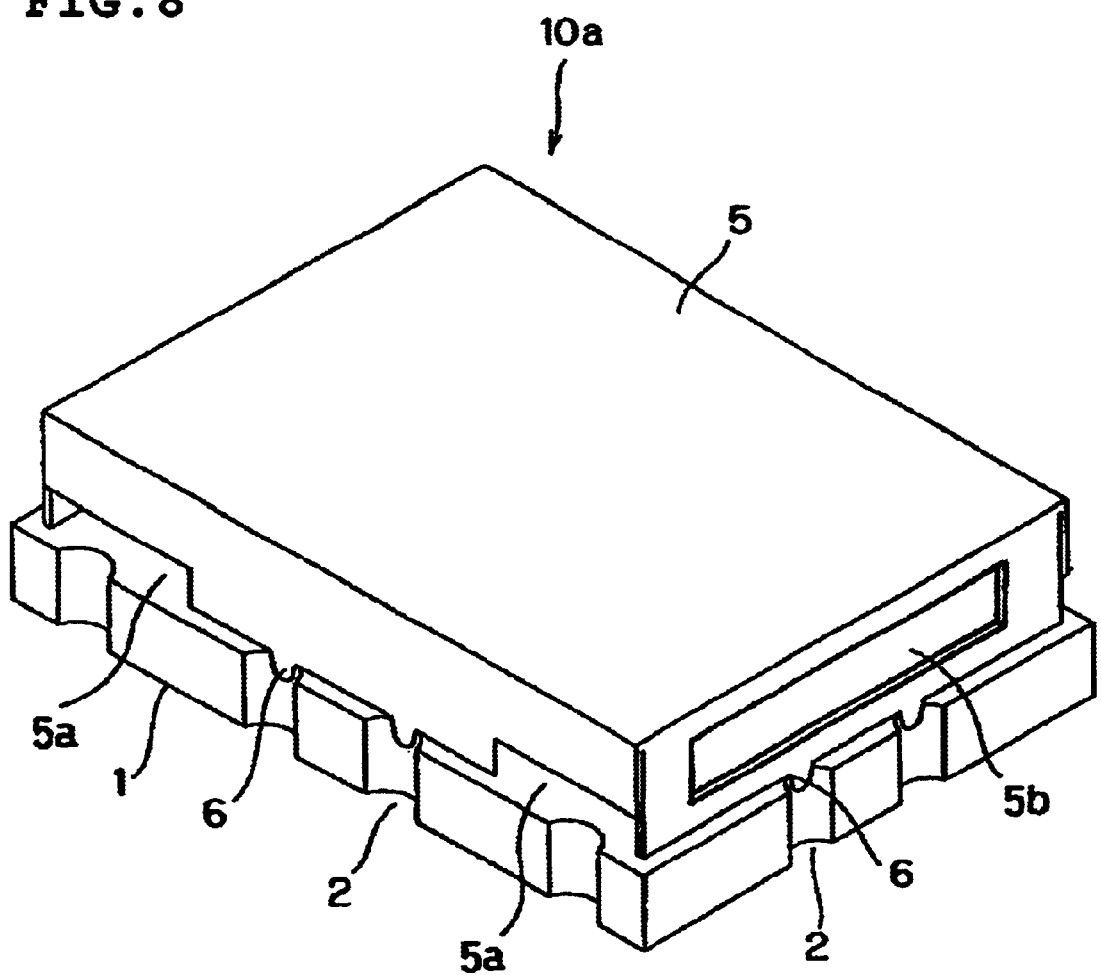
FIG. 8 is a perspective view of an electronic component in a second embodiment of the present invention.
Figure 9:
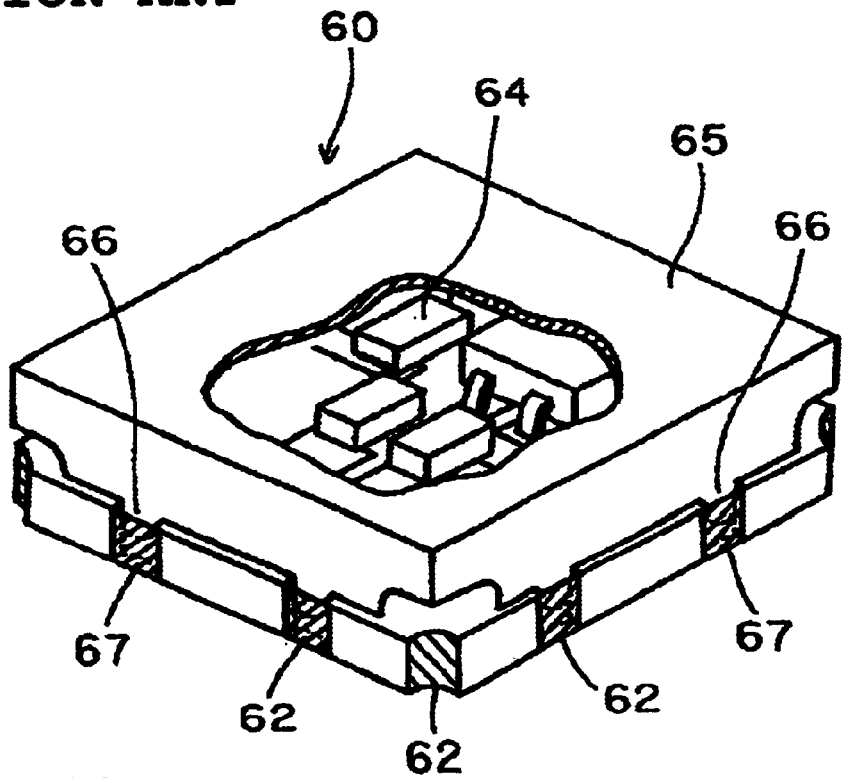
FIG. 9 is a perspective view of a conventional electronic component.
Figure 10:
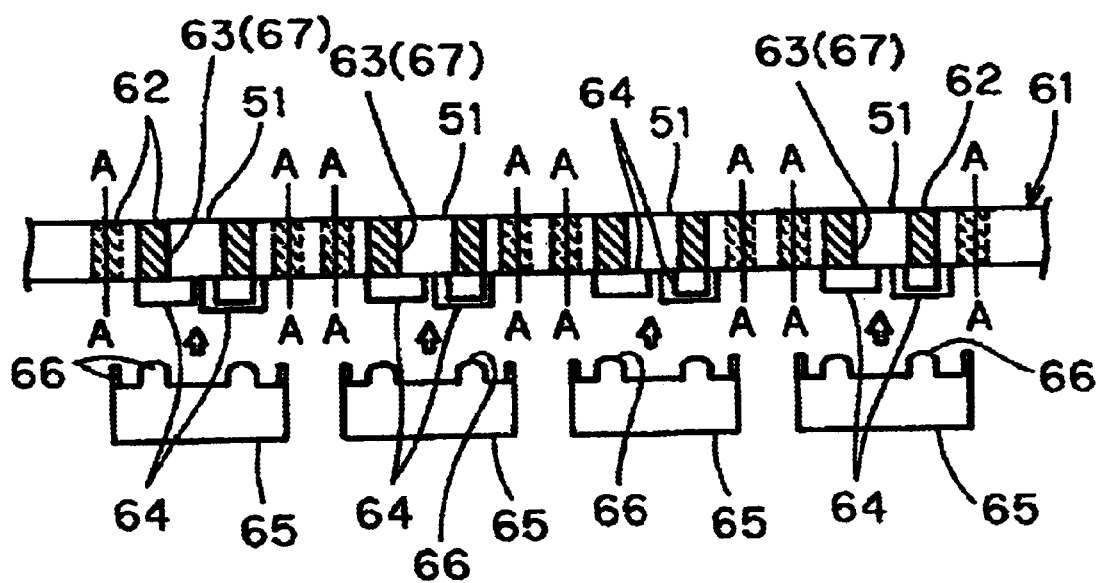
FIG. 10 illustrates a conventional method of producing an electronic component.

FIG. 8: is a perspective view of an electronic component in a second embodiment of the present invention.

In the electronic component of FIG. 8, represented by symbol 10a, in the second embodiment, a shield case 5 is used. It has openings 5a formed in a pair of opposing side surfaces thereof and openings 5b formed in another pair of opposing side surfaces thereof.

Although in FIG. 8 the openings 5a and the opening 5b in two side surfaces that do not oppose each other are only shown, openings 5a (not shown) and an opening 5b (not shown) are similarly formed in the side surfaces opposing the corresponding side surfaces in which the illustrated openings 5a and the illustrated opening 5b are formed.

The electronic component 10a can also be produced by the same first-embodiment method.

Since the shield case 5 of the electronic component 10a in the embodiment has openings 5a in each of two side surfaces thereof and an opening 5b in each of other two side surfaces thereof, it has openings in all four side surfaces. Therefore, after soldering the surface-mount parts and the shield cases onto the printed board, or after cutting the printed board in the dividing step, the insides of the shield cases can be efficiently cleaned.

Consequently, by cleaning off and removing the flux and solder produced by the soldering or cleaning off and removing scraps produced when the board is cut, it is possible to prevent quality deterioration and thus obtain highly reliable products.

In the first and second embodiments a mother printed board is used, and after soldering the surface-mount parts and the shield cases, the mother printed board is cut and divided into individual electronic components. However, a mother printed board does not have to be used. It possible to use printed boards previously divided for forming individual electronic components.

Although in the above-described embodiments the methods are applied to produce high-frequency electronic components, such as voltage-controlled oscillators (VCOs), used in, for example, communication devices, the present invention may be used to produce other types of electronic components.

The present invention of the application is not limited to the first and second embodiments on other features. Therefore, within the scope of the invention, various applications and modifications can be made as regards, for example, the form of the printed boards, the connection land electrode and the case-fixing electrode patterns, the specific forms and structures of the shield cases and their engaging portions, or the forms, the locations or the number of openings formed in the shield cases.

What is claimed is:

1. An electronic part production method comprising the steps of:

providing a printed board with a plurality of connection land electrodes, a plurality of case-fixing electrodes, and a plurality of engaging holes;

applying solder paste to the plurality of connection land electrodes, to which a plurality of surface-mount parts are to be electrically and mechanically connected, and to the plurality of case-fixing electrodes, to which engaging portions of a plurality of shield cases are to be electrically and mechanically connected;

mounting the plurality of surface-mount parts and the plurality of shield cases onto predetermined locations of the printed board, each of the plurality of shield cases being mounted so as to accommodate at least one of the plurality of surface-mount parts therein; and carrying out reflow soldering in order to simultaneously solder the plurality of surface-mount parts onto the plurality of connection land electrodes and solder the engaging portions of the plurality of shield cases onto the plurality of case-fixing electrodes by putting the printed board on which the plurality of surface-mount parts and the plurality of shield cases are mounted into a reflow oven and melting the solder in the solder paste;

wherein each of the case-fixing electrodes is disposed in an inner periphery of a corresponding one of the plurality of engaging holes formed in the printed board, and wherein at least one of the engaging portions on each of at least one longer side and at least one shorter side of at least one of the plurality of shield cases engages the same case-fixing electrode as at least one of the engaging portions of another one of the plurality of shield cases.

2. An electronic part production method according to claim 1, wherein the step of applying solder paste is carried out so that the solder paste is simultaneously applied to the plurality of connection land electrodes and the plurality of case-fixing electrodes.

3. An electronic component production method according to claim 2,
wherein after the step of carrying out reflow soldering the method further comprises the step of dividing the printed board into a plurality of electronic components by cutting the printed board.

4. An electronic component production method according to claim 2, wherein an opening is formed in at least a portion of at least one of the plurality of shield cases, and wherein after the step of carrying out reflow soldering the plurality of surface-mount parts and the plurality of shield cases onto the printed board, at least one of an inside of the at least one of the plurality of shield cases and the at least one of the plurality of shield cases is cleaned.

5. An electronic part production method according to claim 1, wherein the step of applying solder paste is carried out so that the solder paste is separately applied to the plurality of connection land electrodes and the plurality of case-fixing electrodes.

6. An electronic component production method according to claim 5, wherein an opening is formed in at least a portion of at least one of the plurality of shield cases, and wherein after the step of carrying out reflow soldering the plurality of surface-mount parts and the plurality of shield cases onto the printed board, at least one of an inside of the at least one of the plurality of shield cases and the at least one of the plurality of shield cases is cleaned.

7. An electronic component production method according to claim 1, wherein in the step of applying a solder paste, the solder paste is applied to the printed board so as to cover at least a portion of each of the plurality of engaging holes in the printed board.

8. An electronic component production method according to claim 1, wherein the engaging portions of the plurality of shield cases have a length in which the engaging portions do not protrude beyond a back surface of the printed board via the engaging holes from a surface of the printed board on which the plurality of shield cases are mounted.

9. An electronic component production method according to claim 1,
wherein after the step of carrying out reflow soldering, the method further comprises the step of dividing the printed board into a plurality of electronic components by cutting the printed board.

10. An electronic component production method according to claim 7, wherein an opening is formed in at least a portion of at least one of the plurality of shield cases, and wherein after the step of carrying out reflow soldering the plurality of surface-mount parts and the plurality of shield cases onto the printed board, or after cutting the printed board in the dividing step, at least one of an inside of the shield case and the shied case is cleaned.

11. An electronic component production method according to 4, wherein an opening is formed in at least a portion of at least one of the plurality of shield cases, and wherein after the step of carrying out reflow soldering the plurality of surface-mount parts and the plurality of shield cases onto the printed board, at least one of an inside of the at least one of the plurality of shield cases and the at least one of the plurality of shield cases is cleaned.

12. An electronic component production method according to claim 1, wherein the engaging portions of the plurality of shield cases include a pawl-shaped protrusion.

* * * * *